United States Patent [19]
Harris

[11] 3,957,015
[45] May 18, 1976

[54] POLYMER FLOW CONTROL SYSTEM FOR USE AND MANUFACTURE OF PRINTING PLATES

[75] Inventor: Lawrence W. Harris, Raleigh, N.C.

[73] Assignee: News & Observer Publishing Co., Raleigh, N.C. ; a part interest

[22] Filed: Mar. 15, 1974

[21] Appl. No.: 451,444

[52] U.S. Cl. ............................... 118/100; 118/315
[51] Int. Cl.² ........................................ B05C 11/04
[58] Field of Search .......... 118/315, 413, 100, 120, 118/108, 414, 415; 222/486; 96/35.1; 355/125

[56] References Cited
UNITED STATES PATENTS

| | | |
|---|---|---|
| 3,240,184 | 3/1966 | Lemieux et al. ..................... 118/108 |
| 3,319,600 | 5/1967 | Regan ............................. 118/108 X |
| 3,402,695 | 9/1968 | Baker et al. ...................... 118/315 X |
| 3,782,327 | 1/1974 | Wessells et al. .................... 118/100 |
| 3,785,001 | 1/1974 | Niemi et al. ...................... 118/108 X |

Primary Examiner—John P. McIntosh
Attorney, Agent, or Firm—Mills & Coats

[57] ABSTRACT

In abstract, a preferred embodiment of this invention is a flow control system used in conjunction with the manufacture of polymer type printing plates to give even distribution of the liquid polymer prior to its being formed to a printing plate for use on a high speed printing press such as used by newspapers.

6 Claims, 20 Drawing Figures

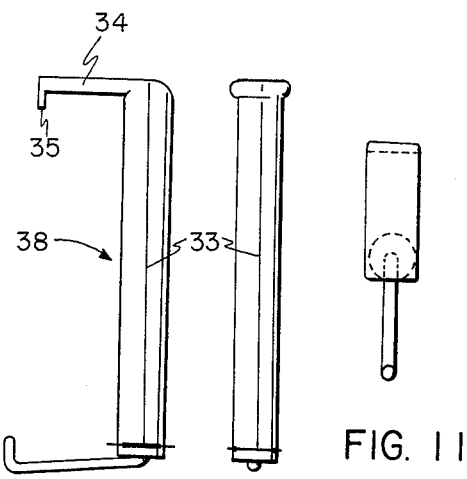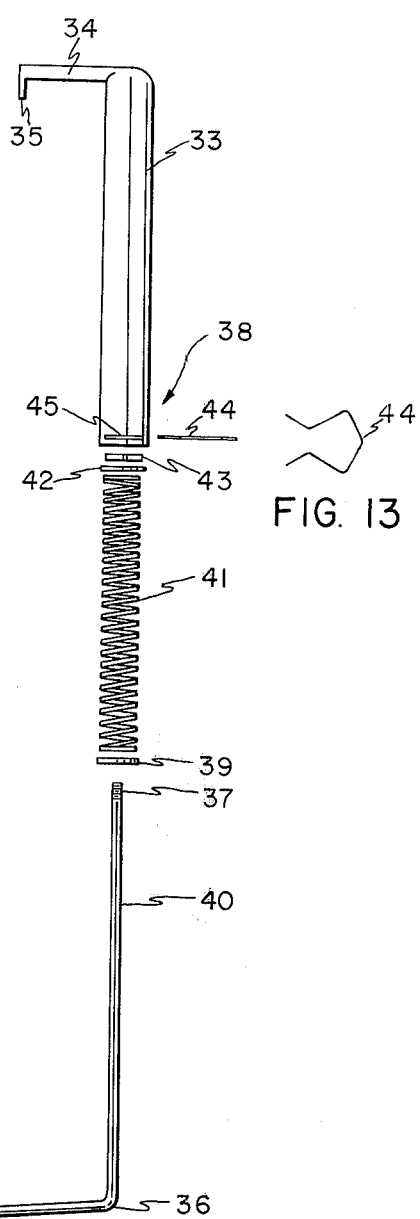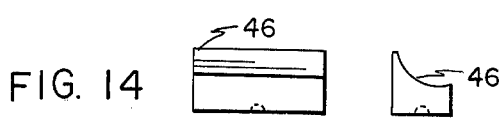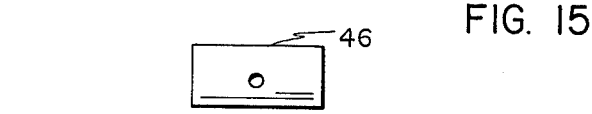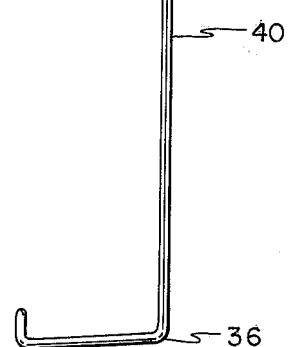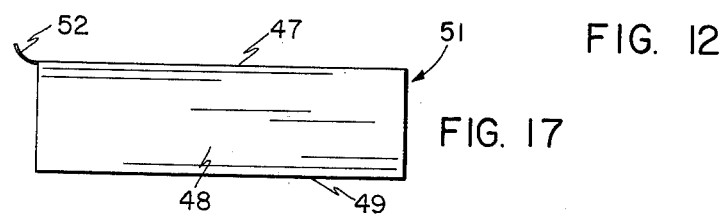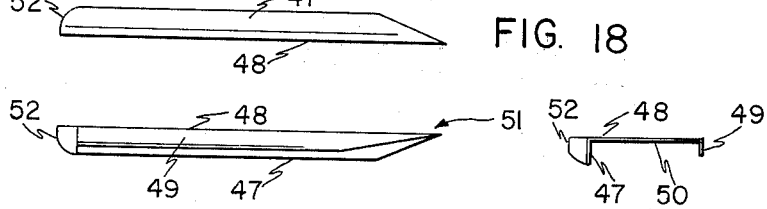

POLYMER FLOW CONTROL SYSTEM FOR USE AND MANUFACTURE OF PRINTING PLATES

This invention relates to control systems and more particularly to polymer control systems used in connection with the manufacture of printing plates for high speed presses.

In the past, plates for printing presses were produced by handsetting of type and later by some automatic machines such as linotypes. These prior known systems for producing printing plates were time consuming and laborious at best. Modern technology in recent years has developed systems for producing printing plates utilizing photosensitive type processes with the actual plate itself being produced from a plastic type material photosensitive such as polymers. One of the more successful systems of this type is the W. R. Grace and Company "Letterflex" printing plate producing apparatus. These machines are widely used in the newspaper industry for producing printing plates, particularly for use on high speed presses. Because of the large number of plates required for major daily newspapers, large amounts of polymer are consumed. Although the time and labor saved more than justifies the cost involved, it is nevertheless a very expensive process. With the cost of polymers climbing steadily, any savings of material amounts to a large monetary savings to publisher.

With particular reference to the Grace device, regardless of how carefully adjusted it will either spread excess polymer across the end of the platen plate or will give an unacceptable corner skipping effect as will hereinafter be described in more detail.

After much research and study into the above mentioned problems, the present invention has been developed to more accurately control the flow of polymer onto the platen plate of a "Letterflex" type device over the entire area of the printing plate to be made and yet will not distribute excessive polymer, particularly at the end of the polymer spreading step of the process.

To be more specific, when the "Letterflex" device dispenses polymer to make a printing plate, the polymer flows under each end of what is commonly referred to as the doctor blade foot of the doctor blade which smoothes and spreads the polymer. Also, the polymer is spread too far back in some places at the end of the spreading process on the plate backing. The main cause of this undesirable spreading is due to the fact that an even amount of polymer is not dispensed along the full length of the dispensing valve. This is true even when the machine is adjusted as correctly as possible.

The above, as heretofore mentioned, requires more polymer than is needed to make a printing plate due to the spread of the polymer in unusable areas on the plate backing. To eliminate polymer from the unusable areas of the backing plate, the combination of doctor blade foot extenders and one or more polymer dispense control pads are used.

The doctor blade foot extender is attached to the foot of each end of the doctor blade and extends downwardly to the contact the plate or backing making a skate type effect to dam the polymer from flowing under the foot.

Likewise, along the length of the dispensing valve where too much polymer is being disbursed, the polymer dispense control pad is attached and is held in proper operative location by a pad holder. This pad covers one or more of the holes or orifices in the dispensing valve thereby allowing less polymer to be dispensed. By controlling the flow of polymer from heavy flow areas of the dispenser valve, the area ordinarily having light flow will increase. Thus using different lengths and/or numbers of pads, an extremely accurate control of both amounts and distribution of polymer can be accomplished.

In view of the above, it is an object of the present invention to provide a polymer control system for eliminating excessive waste during the production of polymer type printing plates.

Another object of the present invention is to provide, in a device for producing polymer type printing plates, a liquid polymer dispense valve auxiliarily flow control means.

Another object of the present invention is to provide, in a polymer printing plate producing apparatus, a means for preventing liquid polymer from flowing under the ends of the standard polymer spreading doctor blade.

Another object of the present invention is to provide a pad type device to more accureately control the flow of polymer from a dispensing valve on a polymer printing plate producing apparatus.

Another object of the present invention is to provide, on the doctor blade of a polymer type printing plate producing apparatus, a doctor blade foot extender for "damming up" and preventing liquid polymer from flowing beneath the doctor blade foot.

Another object of the present invention is to provide an extremely accurate flow control and distribution system for polymer type printing plate producing apparatus.

A further object of the present invention is to provide a flow control device for temporarily closing a portion of the orifices in a manifold type dispersing means including an orifice covering pad biased in contactive operative position.

Another object of the present invention is to provide, in a flow control device, a biasing means including a plunger slidably operable within a cylinder with a spring means operatively disposed within.

Another object of the present invention is to provide skate shaped damming device attached to the doctor blade foot of a spreading apparatus.

Other objects and advantages of the present invention will become apparent and obvious from a study of the following description and the accompanying drawings which are merely illustrative of such invention.

IN THE DRAWINGS

FIG. 9 is a side elevational view of the dispensing valve control of the present invention;

FIG. 10 is an end elevational view of the same;

FIG. 11 is a top plan view of the same;

FIG. 12 is an exploded view of the dispense valve control;

FIG. 13 is a top plan view of the retaining clip;

FIG. 14 is a front elevational view of a typical flow control pad;

FIG. 15 is an end elevational view of the same;

FIG. 16 is a bottom plan view of such pad;

FIG. 17 is a top plan view of the doctor blade foot extender;

FIG. 18 is a side elevational view of the same;

FIG. 19 is an opposite elevational view of the same; and

FIG. 20 is an end elevational view of such extender.

Figure 2:
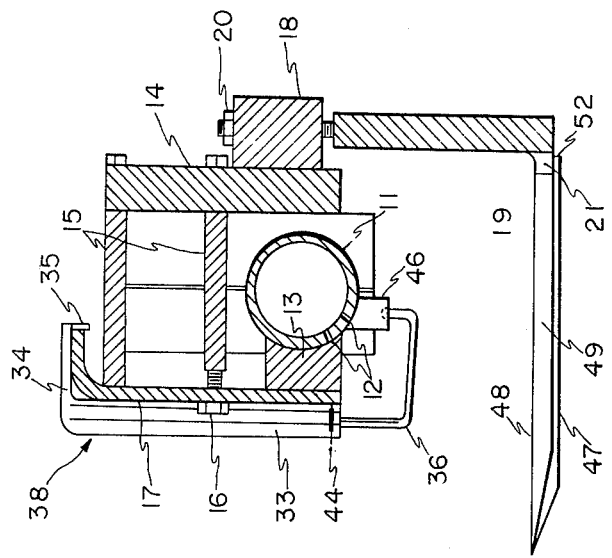
FIG. 2 is a section taken through lines 2—2 of FIG. 1.
Figure 1:
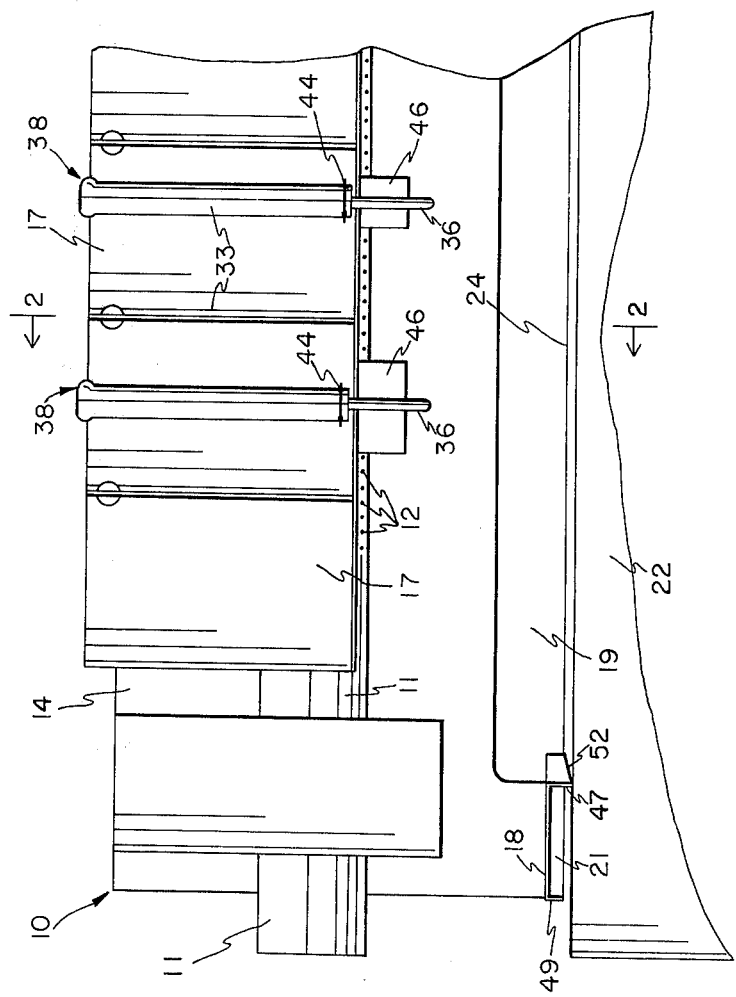
FIG. 1 is an enlarged fragmentary view of a machine incorporating the system of the present invention for making polymer press plates.

With further reference to the drawings, a polymer printing plate producing machine such as the W. R. Grace and Company "Letterflex" machine is indicated generally at 10. Since these machines are widely used throughout the printing industry, particularly the newspaper industry, details of the device will not be shown or described except as they relate directly to the improvement of the present invention.

In machines of the type indicated, a dispense valve in the form of an elongated, generally cylindrical manifold 11 is provided. This manifold has a plurality of orifices 12 provided therein. A dispense valve shoe 13 controls the cutoff of polymer or other material flowing through orifices 12 since manifold 11 is adapted to rotate about its longitudinal axis thus either exposing or covering said orifices by said shoe. Since this rotative movement of manifold 11 is controlled by standard machine parts of the printing plate producing machine 10, no further detailed description of its control or motivating mechanism is deemed necessary.

A carriage carrier frame 14 is provided which is adapted to supportingly carry both the doctor blade hereinafter to be described in more detail and the dispense valve manifold. This carriage carrier 14 is adapted to transverse back and forth across a platen in adjusted relation thereto. The motivating means for the carriage frame and the controls thereof are standard equipment on the machine on which the present invention is mounted and, therefore, are well known to those skilled in the art and further description thereof is not deemed necessary.

Spacers 15 are provided on the dispense side of the carrier frame 14 and are adjustable by means such as nuts 16. Spacers 15 adjustably support dispense valve manifold 11 and its associated valve shoe 13 by way of front members 17 as clearly seen in FIG. 2.

Secured to the rear portion of carrier frame 14 is a mounting block 18 which adjustably mounts doctor blade 19 by means such as a plurality of bolts and their associated nuts 20. A forwardly projecting doctor blade foot 21 is provided on the front of doctor blade 19 and it is on this projection that the doctor blade foot extender (that is hereinafter described) is attached.

The standard polymer printing plate producing machine 10 hereinabove identified includes a standard platen 22, having vacuum grooves 23 in the upper portion thereof. An aluminum plate 24 is adapted to lie on platen 22 and is held in contactive relation thereto by vacuum system (not shown) operative with vacuum groove 23.

A negative holder frame 25 is operatively mounted on the carriage frame 14. This negative holder frame supports, in a normally relatively upright position, a copy glass with an etched vacuum track 27 on a portion thereof. This vacuum track holds in proper position an overlay sheet 28. The overlay sheet in turn holds in correct exposure position film 29 from which the polymer printing plate is produced.

A plurality of shims 30 are provided on plate 24 to provide an air space between the polymer coating 31 which is processed into a polymer printing plate and the film protecting and holding overlay sheet 28.

Figure 4:
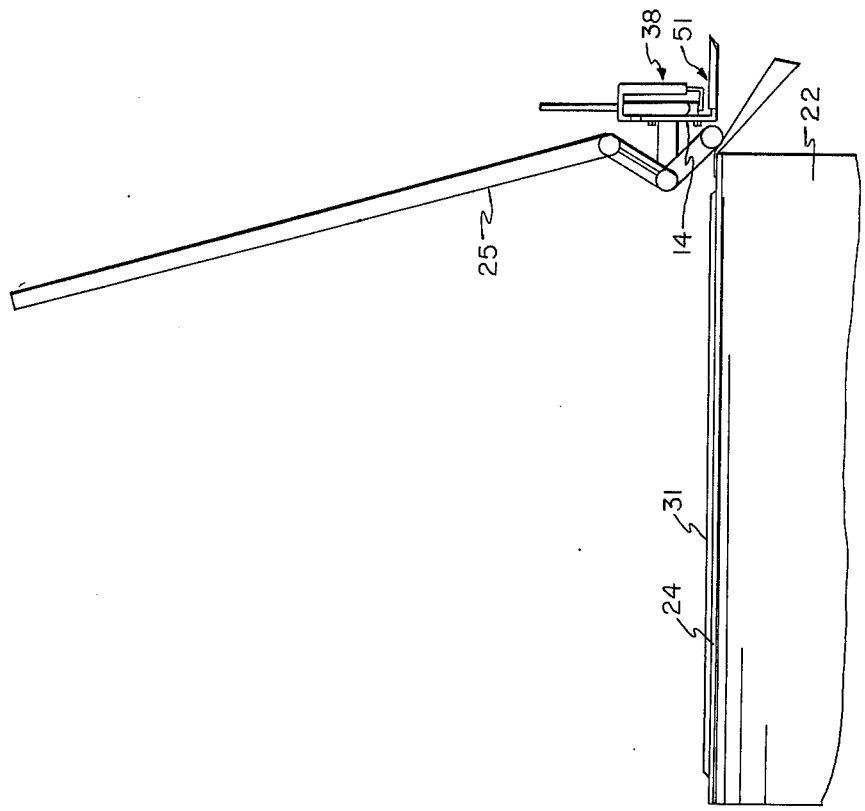
FIG. 4 is a schematic view showing the system of FIG. 3 in a different position.
Figure 3:
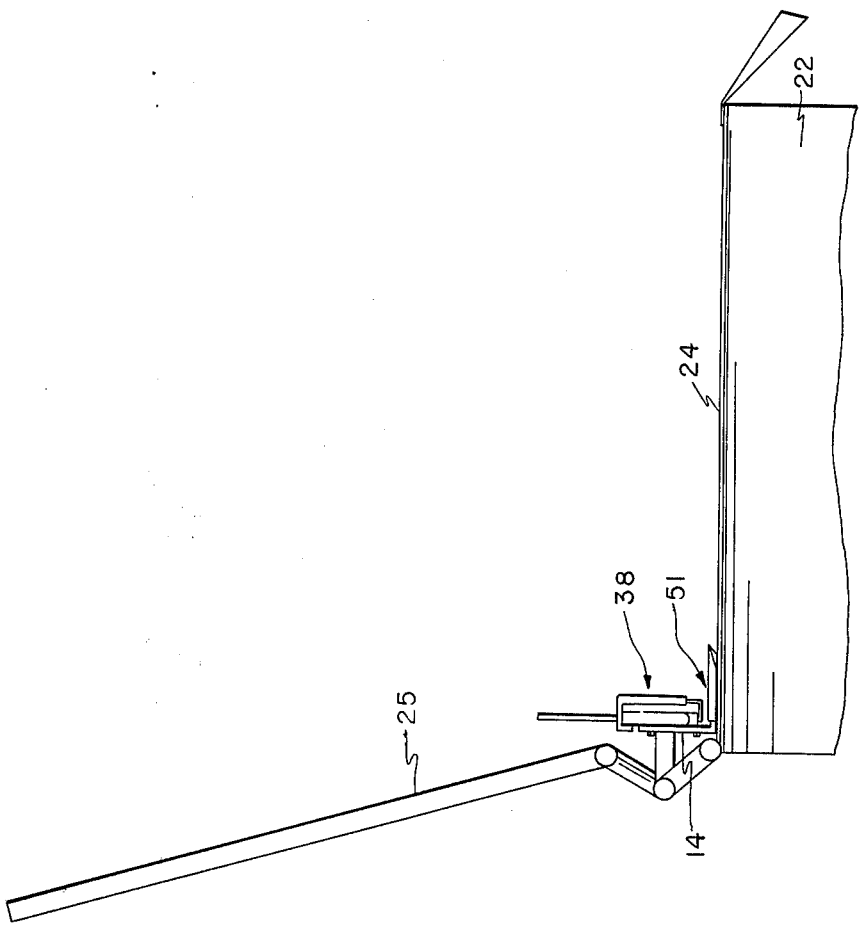
FIG. 3 is a schematic type drawing of the system of the present invention as related to the platen of the press plate producing machine.
Figure 5:
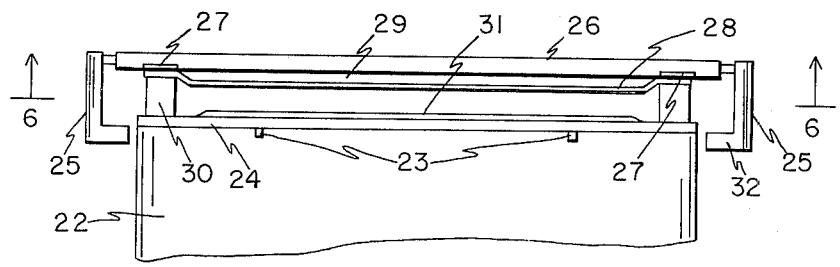
FIG. 5 is a fragmentary end view of the platen and its associated polymer plate producing apparatus.

When the negative holder frame 25 is in the raised position as shown in FIG. 3, the copy glass 26 is supported by flanges 32 of such frame. When the holder frame lowers into plate producing relationship with platen 22, the copy glass 26 is supported by shims 30 without contact with the negative holder frame 25 as clearly seen in FIGS. 4 and 6.

The disclosure of the present invention is directed to better control of the flow and pattern of photosensitive polymer on the platen backing plate 24 prior to the processing of such polymer into a polymer printing plate.

To produce a polymer printing plate on a "Letterflex" type machine as hereinabove described, the carrier frame 14 moves over the platen 22 and its associated backing plate 24 to the position shown in FIG. 3. Dispense valve 11 then rotates and remains open for a predetermined period of time so that a predetermined amount of polymer can be dispensed. This valve then rotates closed and the frame with its attached dispense assembly, doctor blade and negative holder frame moves across the platen 22 to the position shown in FIG. 4. While the frame 14 and its associated apparatus so moves across the platen, the doctor blade 19 spreads the dispensed polymer to an even predetermined thickness (which is determined by the elevation of such doctor blade above backing plate 24).

In continued normal operation of the machine, the negative holder frame 25 moves downwardly until copy glass 26 is supported in space relation above the spread polymer by shims 30. Ultra violet rays are then projected through film 29 and the areas of exposure begun hardening by normal chemical reaction within the photosensitive polymer. After proper predetermined time exposure, holder frame 25 is raised taking with it the copy glass 26 and its associated film and overlay sheet. The backing plate 24 is then removed to an etching tank (not shown) where the soft, unhardened polymer is washed off leaving exposed the hardened portions as raised print, pictures or the like. The now produced printing plate is then placed in an ultra violet "oven" for final hardening prior to being trimmed and adapted for operative mounting on a printing press.

Figure 6:
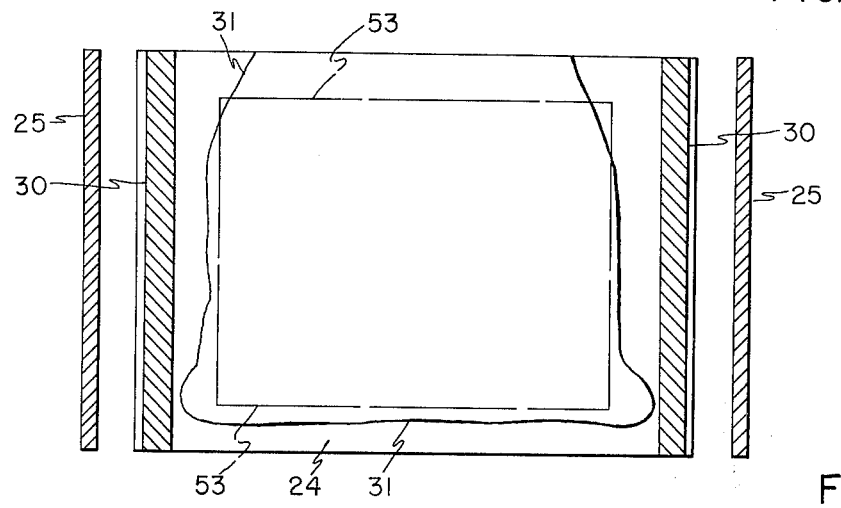
FIG. 6 is a section taken through lines 6—6 of FIG. 5.

One of the main problems encountered in the production of the polymer printing plate as hereinabove described has been that, after the liquid polymer has been dispensed from the dispense valve, it flows under the doctor blade foot at each end of the doctor blade thereby requiring that the same either be wiped clear by hand or a new plate made. Also, as the doctor blade spreads the polymer across the surface of the backing plate 24, the polymer is spread beyond the area needed for proper exposure and in many instances toward the end of the spreading operation will leave corners with inadequate or no polymer thus preventing a usable printing plate from being produced. Since, on a standard "Letterflex" type machine the only control for dispensing of polymer is the pressure of the polymer within the dispense valve itself, when this pressure is increased to dispense more polymer to prevent inadequate spread at the back corners of the plaste as illustrated in FIG. 6, the problem of polymer flow under the doctor blade foot is compounded.

To overcome the two compounding problems hereinabove described, as well as to reduce the overall amount of polymer required in the production of each plate, the present dispense valve flow control and the doctor blade foot extender have been developed. When these two means are used together in a single system, a uniform pattern of polymer spread is accomplished as is graphically illustrated in FIG. 8. The initial overflow areas under the doctor blade foot are eliminated as well as the skipped corner spread and central overflow as illustrated in FIG. 6. By preventing this uniform polymer spreading, the smallest possible amount is required for each plate produced thus providing a substantial dollar saving to the manufacturer of the printing plates.

To allow more accurate dispense valve flow control, the device disclosed in detail in FIGS. 9 through 16 has been provided. This device is in the form of a hollow, cylindrical housing 33 having an outwardly projecting arm 34 that is fixedly secured to one end thereof. This arm terminates in a downwardly turned hook 35 which is adapted to retainingly engage the upper portion of frame 17. A J-shaped biasing arm is provided which is threaded at its end 37.

When the polymer dispense control indicated generally at 38 is assembled, washer 39 is mounted on shaft portion 40 of biasing arm 36. Biasing spring 41 is then mounted on shaft 40 followed by washer 42 which is held in place by nut 43 which is threaded onto portion 37.

The biasing arm assembly hereinabove described is then inserted into the cylindrical housing 33 and spring retaining clip 44 is inserted into slots 45 beneath washer 39 thus retaining the same within said housing. Since spring 41 biases washers 39 and 42 apart, in assembled position arms 34 and 36 are biased toward each other and are in a normal static position as illustrated in FIG. 9.

To control the flow of polymer from the dispense valve 11, one or more polymer dispense controls 38 are mounted on frame 17. This mounting is operatively accomplished as is clearly illustrated in FIG. 2 wherein the housing arm 34 is placed in retaining engagement with frame 17 while the biasing arm 36 is disposed adjacent manifold 11. The manifold contact pads 46 have an opening 46 on one side thereof for insertion of the end of the arm 36. Thus it can be seen that biasing spring 41 holds the dispense control pad 46 against dispense valve 11 and juxtaposed to valve shoe 13. The control pad 46 can be of varying length depending on the number of orifices 12 in the dispense valve to be covered and thus prevented from dispensing polymer.

As heretofore mentioned, one or more dispense controls 38 can be mounted on carriage frame 14 as deemed desirable. Thus, it can be seen that wherever along the elongated dispense valve 11 an excessive amount of polymer is dispensed due to uneven pressures, clogging of orifices or other reasons, dispense controls 38 can be added. As these controls reduce the amount of polymer dispensed from one area, larger amounts of polymer will be caused to flow from the uncovered or unrestricted orifices along the dispense valve. By proper distribution and number of dispense controls being used as well as proper control pad sizes, very accurate control of the polymer dispensed on backing plate 24 can be accomplished.

Although accurate dispense control of the polymer is essential in efficient, unwasteful operation of the printing plate producing machine, this in and of itself will not give complete, accurate distribution due to the tendency of the polymer, during the doctoring process, to flow around the ends of the doctor blade and beneath the doctor blade foot 21 thereof. To overcome this problem, a doctor blade foot extender has been devised. This foot extender is in the form of an ice skate shaped blade 47 with a perpendicular clip portion 48 terminating in a doctor blade retaining flange 49.

Since the area 50 defined by blade 47, the flat clip portion 48 and the retaining flange 49, as clearly seen in FIG. 20, is slightly smaller than the doctor blade foot 21, the foot extender unit indicated generally at 51 can be snapped thereonto and held in relatively fixed position by the resiliency of the metal forming the clip portion.

To aid in the proper distribution of the polymer being spread by the doctor blade, a curved, tapered flange 52 is provided at the rear thereof. This flange carries undesirable build-ups along so that even distribution over the entire length of operation of the doctor blade can be accomplished without undesirable runs beneath the doctor blade foot as heretofore has been the case.

To incorporate the control system of the present invention on standard polymer press plate producing machine, all that is required is for the arm 34 of the polymer dispense control 38 to be hooked over frame 17 and biasing arm 36 pulled against biasing spring 41 to adjust the position of control pad 46 on dispense manifold 11 and juxtaposed to valve shoe 13. Any desired number of dispense controls 38 can be mounted as necessary to assure even dispense of polymer across the entire print plate area.

To give additional control of the polymer relative to the edges of the same when spread over the backing plate 24, the doctor blade foot extender 51 is snapped onto the doctor blade foot 21. Thus a damming effect is accomplished as the doctor blade 19 moves in predetermined spaced relation to the backing plate 24 to smooth the polymer dispensed thereon. As will be noted from the drawings, the blade portion of 47 of the doctor blade foot extender is adapted to move in contactive engagement with plate 24 during the spreading operation. Also as the side flow of polymer from the doctor blade 19 builds-up against extender blade portion 47, extender flange 52 forces such polymer back toward the doctor blade for further spreading and tapers the edge of such polymer as is seen clearly in FIG. 6.

Thus from the above, it can be seen that the doctor blade foot extender not only prevents the polymer from spreading laterally around the edge of the doctor blade which is smoothing the polymer, but also throws excessive build-up, because of flange 52, back toward the doctor blade to assure adequate and accurate operation of such blade.

Figure 8:
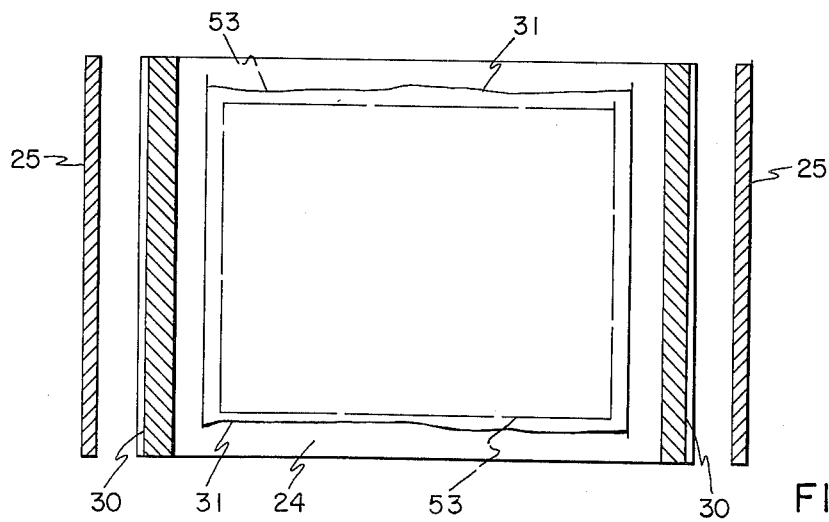
FIG. 8 is a section taken from lines 8—8 of FIG. 7.

Once the dispense control or controls 38 and the doctor blade foot extender 51 have been correctly installed and adjusted on the polymer printing plate producing apparatus, the same is ready for operation. The unit module including the dispense valve, the doctor blade and the negative or film frame holder is moved by normal machine motivating apparatus (not shown) to the position shown in FIG. 3 over the platen 22 and its associated backing plate 24. At this point, the normal operation of the printing plate producing machine will dispense an adjusted, predetermined amount of polymer from dispense valve 11. Once the polymer flow has been cutoff by rotation of the valve into the position shown in solid lines in FIG. 2, the spreading process can begin. At this point the dispense valve, doctor blade, frame holder module begins to move across platen 22 to the position shown in FIG. 4. As this module moves, the doctor blade, which is set a predetermined distance above backing plate 24, smoothes the dispensed polymer at an even thickness across the surface of said backing plate. The doctor blade foot extender prevents undesirable flow around the edges of the doctor blade during the smoothing process and also, because of even distribution of the polymer initially from valve 11, the run out at the end of the smoothing operation will be relatively even as illustrated in FIG. 8 rather than the off edge or missed corner dispersion illustrated in FIG. 6 (wherein the system of the present invention is not used).

Figure 7:
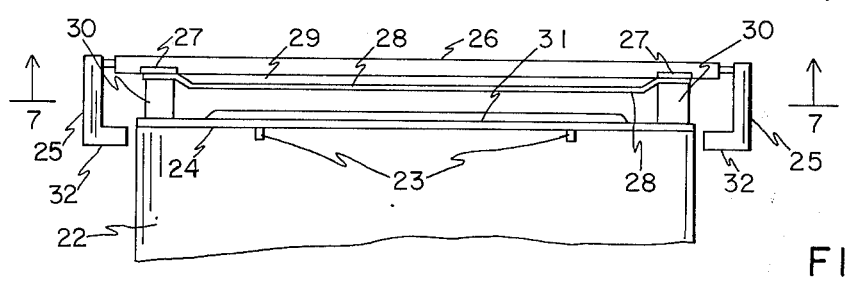
FIG. 7 is a fragmentary end view of platen of the polymer plate producing device showing the polymer spread through use of the present invention.

Once the polymer 31 has been spread to the proper thickness, the negative support glass is lowered to the position shown clearly in FIG. 7 and the plate producing process can be activated as hereinabove described.

From the above, it can clearly be seen that the control system of the present invention allows a much more even distribution of polymer over its backing plate while at the same time preventing wasteful excess from being disbursed. The present invention thus also has the advantage of combining a polymer use reduction system while at the same time gaining more accureate and efficient distribution thereof. The control system of the present invention has the even further advantage of being inexpensive to produce and install and yet has a low maintenance characteristic.

The present invention may, of course, be carried out in other specific ways than those herein set forth without departing from the spirit and essential characteristics of the invention. The present embodiments are, therefore, to be considered in all respects as illustrative and not restrictive and all changes coming within the meaning and equivalency range of the appended claims are intended to be embraced herein.

What is claimed is:

1. In a device for producing polymer printing plates, said device including a dispense valve having a plurality of orifices therein and an elongated doctor blade adapted to transverse a backing plate at a predetermined spaced distance therefrom to spread disbursed polymer on such plate, a polymer flow control system comprising: means for preventing the flow of polymer from at least one of said plurality of orifices in said dispense valve, said preventing means including a generally C-shaped means with the ends thereof biased toward each other and grippingly disposed on opposite sides of said dispensing valve with one end being adapted to cover at least one of said orifices whereby better polymer disbursion can be accomplished; and means for preventing the dispersed polymer from flowing around at least one end of said elongated doctor blade during the spreading of said polymer whereby the spread pattern of such a polymer can be more accurately controlled.

2. The control system of claim 1 wherein an orifice covering pad is mounted on said orifice covering end of said means.

3. The control system of claim 2 wherein the bias of said means is in the form of an internally mounted biasing spring.

4. The control system of claim 3 wherein the means for preventing the dispersed polymer from flowing around at least one of the ends of said doctor blade is in the form of a blade-like member mounted adjacent the end of said doctor blade and being disposed perpendicular thereto with at least a portion of said blade-like member being in contact with the surface upon which the polymer is being spread.

5. The control system of claim 4 wherein a flange is provided on one end of said blade for causing excessive polymer build-up to be turned back adjacent said doctor blade for further spreading by such blade.

6. In a device for producing polymer printing plates, said device including a dispense valve having a plurality of orifices therein movably mounted adjacent a relatively fixed backing plate and an elongated doctor blade movably mounted to transverse said backing plate at a predetermined spaced distance therefrom to spread polymer dispensed by said valve on such plate, a polymer flow control system comprising: means for preventing the flow of polymer from at least one of said plurality of orifices in said dispense valve whereby better polymer disbursion can be accomplished; and means for preventing the dispersed polymer from flowing around the ends of said elongated doctor blade during the spreading of said polymer, said means for preventing the dispersed polymer from flowing around the ends of said doctor blade being in the form of a blade-like member mounted adjacent the end of said doctor blade and being disposed perpendicular thereto with at least a portion of said blade-like member being in contact with the surface upon which the polymer is being spread, and an extender flange means connected to the rear of said blade-like member adjacent said doctor blade to force any polymer build-up back toward said doctor blade whereby the spread pattern of such polymer can be more accurately controlled.

* * * * *